(12) United States Patent
Nadd et al.

(10) Patent No.: US 6,998,899 B2
(45) Date of Patent: Feb. 14, 2006

(54) METHOD AND APPARATUS TO REMOTELY SENSE THE TEMPERATURE OF A POWER SEMICONDUCTOR

(76) Inventors: Bruno C. Nadd, Impasse des Gardes, Lourmarin (FR) 84160; Vincent Thiery, 5 rue des Genevriers l'oree du bourg, LaRoque d'Antheron (FR) 13640

( * ) Notice: Subject to any disclaimer, the term of this patent is extended or adjusted under 35 U.S.C. 154(b) by 0 days.

(21) Appl. No.: 10/625,031

(22) Filed: Jul. 22, 2003

(65) Prior Publication Data
US 2004/0227545 A1    Nov. 18, 2004

Related U.S. Application Data

(60) Provisional application No. 60/477,420, filed on Jun. 10, 2003, provisional application No. 60/470,476, filed on May 14, 2003, provisional application No. 60/470,063, filed on May 12, 2003.

(51) Int. Cl.
*H01L 37/00*    (2006.01)

(52) U.S. Cl. .................... 327/513; 374/170

(58) Field of Classification Search ........ 327/108–112, 327/434, 436, 437, 512, 513; 374/163, 170, 374/182
See application file for complete search history.

(56) References Cited

U.S. PATENT DOCUMENTS 5,796,278 A * 8/1998 Osborn et al. .............. 327/108
6,507,227 B2 * 1/2003 Genova et al. ............. 327/109

* cited by examiner

*Primary Examiner*—Kenneth B. Wells

(57) ABSTRACT

Apparatus for indirectly sensing the temperature of a power MOS device comprising a power MOS device having a current sense circuit for sensing the current in the power MOS device, a circuit for producing a voltage related to the drain-source voltage of the power MOS device, a comparator coupled to receive at a first input the voltage related to the drain-source voltage of the power MOS device and at a second input a voltage related to the current in the power MOS device, the comparator generating an overtemperature protection signal when a predetermined inequality between the voltages at the first and second inputs to the comparator occurs.

20 Claims, 2 Drawing Sheets

FIG.2

METHOD AND APPARATUS TO REMOTELY SENSE THE TEMPERATURE OF A POWER SEMICONDUCTOR

CROSS REFERENCE TO RELATED APPLICATIONS

The present invention claims the benefit and priority of U.S. Provisional Application Ser. No. 60/470,063 (IR-1852 PROV (2-2287)) filed May 12, 2003 and U.S. Provisional Application Ser. No. 60/477,420 (IR-1852 PROV II (2-3558)) filed Jun. 10, 2003, both entitled "IMPROVED METHOD TO REMOTELY SENSE THE TEMPERATURE OF A POWER SEMICONDUCTOR IN PARTICULAR OF A POWER MOS DEVICE" and further claims the benefit and priority of U.S. Provisional Application Ser. No. 60/470,476 (IR-1851 PROV (2-2286)), filed May 14, 2003, entitled "CURRENT SENSING DRIVER OPERABLE IN LINEAR AND SATURATED REGIONS", the disclosures of each of which are hereby incorporated by reference.

BACKGROUND OF THE INVENTION

The present invention relates to methods and apparatus to remotely sense the temperature of a power semiconductor device and, in particular, of a power MOSFET device.

In order to prevent damage to power semiconductor devices, the maximum operating temperature of the devices should not be exceeded. It is accordingly important to monitor the temperature of power semiconductor devices so that they can be shut down or the current limited through them if the maximum operating temperature is reached in order to prevent damages to the devices. The present invention relates to a method and apparatus for remotely and indirectly determining the temperature of the power semiconductor device, in particular, a power MOSFET by sensing the ON drain-source resistance, i.e., $R_{DSON}$ and thus the voltage between drain and source of the power MOSFET device.

SUMMARY OF THE INVENTION

The above and other objects of the invention are achieved by an apparatus for indirectly sensing the temperature of a power MOS device comprising: a power MOS device having a current sense circuit for sensing the current in the power MOS device; a circuit for producing a voltage related to the drain-source voltage of the power MOS device; a comparator coupled to receive at a first input the voltage related to the drain-source voltage of the power MOS device and at a second input a voltage related to the current in the power MOS device; the comparator generating an overtemperature protection signal when a predetermined inequality between the voltages at the first and second inputs to the comparator occurs.

The objects of the invention are further achieved by an apparatus for indirectly sensing the temperature of a power MOS device comprising a power MOS device having a current sense circuit for sensing the current in the power MOS device wherein the current sense circuit includes a circuit for providing a voltage related to the current in the power MOS device from the sensed current, a comparator coupled to receive at a first input a first voltage related to the voltage across the drain and source of the power MOS device and at a second input the voltage related to the current in the power MOS device, the comparator generating an overtemperature protection signal when a predetermined inequality between the voltages at the first and second inputs to the comparator occurs.

The objects of the invention are also achieved by a method for indirectly sensing the temperature of a power MOS device comprising sensing a first voltage related to the drain-source voltage of the power MOS device, sensing a second voltage related to the current in the power MOS device, comparing the first and second voltages; and generating an overtemperature protection signal when a predetermined inequality between the first and second voltages occurs.

Preferably, the power MOS device has a main current cell and current sense cell, the current sense cell functioning as or as a part of the current sensing circuit.

Other objects and features of the invention will become apparent from the detailed description which follows.

BRIEF DESCRIPTION OF THE DRAWING(S)

The invention will now be described in the following detailed description with reference to the drawings in which.

DETAILED DESCRIPTION OF EMBODIMENTS OF THE INVENTION

Figure 1:
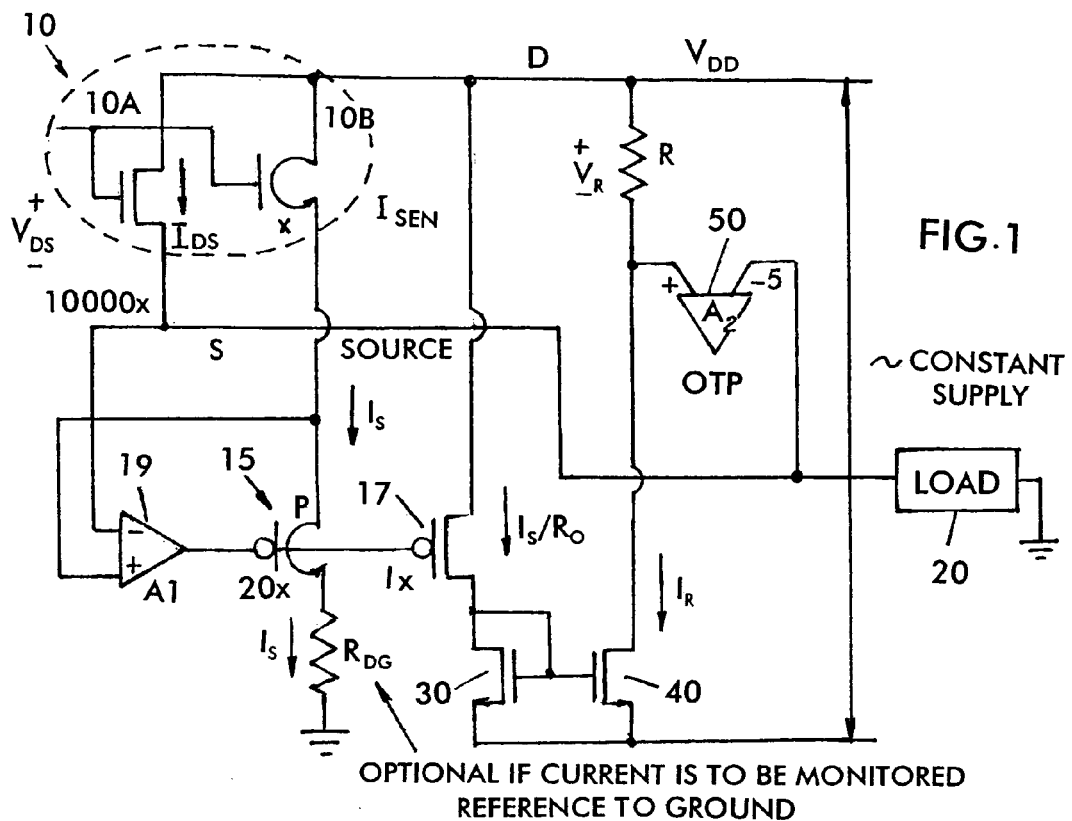
FIG. 1 shows a first circuit for remotely determining the temperature of a power semiconductor device, in particular, a power MOSFET.
Figure 1A:
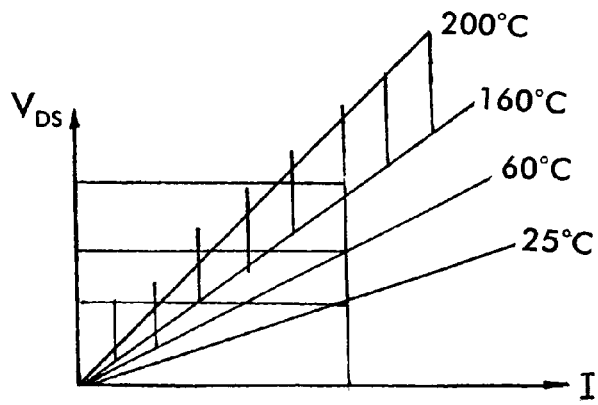
FIG. 1A shows a graph of $V_{DS}$ versus current for various operating temperatures of a power MOS device.

With reference now to the drawings, FIG. 1 shows a first embodiment of a circuit for remotely and indirectly determining the temperature of a power MOS device. The power MOS device is generally indicated at 10 and includes a main drain-source cell 10A and a current sense drain-source cell 10B. For example, the current through cell 10A may be 10,000 times the current through cell 10B.

The source of power MOS device main cell 10A is connected to a load 20, which load may have its other terminal grounded. The current sense cell 10B has its source coupled to the drain of a first P channel MOS transistor 15 which may comprise a MOSFET which is coupled in series with a resistor $R_{DG}$ to ground. Resistor $R_{DG}$ is optional and may be provided if the current is to be monitored. Otherwise, the source of transistor 15 is connected to ground. A further P channel MOS transistor, e.g., MOSFET 17, is coupled such that its gate is connected to the gate of transistor 15 and such that its drain is connected to the drain of transistor 10. Its source is connected to a current mirror comprising transistors 30 and 40, connected in a well known current mirror arrangement. The drain of transistor 40 is coupled through resistor R to the drain of transistor 10. The voltage across resistor R is proportional to $I_R$, which is proportional to the current $I_{SEN}$ in the current sense cell 10B.

An amplifier 19 is coupled such that its non-inverting input is coupled to the source of transistor cell 10B and its inverting input is coupled to the source of cell 10A. A further amplifier 50, operating as a comparator, is coupled as shown and will be described below.

The resistor $R_{DG}$ is external to the integrated circuit of which the device 10, the transistors 15 and 17, amplifiers 19 and 50 and the current mirror 30,40 are preferably internal components.

MOSFET 40 has its drain coupled in series with the resistor R back to voltage VDD. The comparator 50 is coupled as shown. The comparator 50 has its non-inverting terminal coupled to the common connection between resistor R and the drain of MOSFET 40. The current $I_R$ through transistor 40 determines the current $I_R$ through resistor R, and thus the voltage drop across resistor R. The inverting terminal of comparator 50 is coupled to the source of power MOSFET cell 10A, and thus a voltage related to $V_{DS}$ is present at the inverting terminal.

The circuit of FIG. 1 operates as follows. As the temperature of device 10 increases, the drain-source voltage also increases. This is shown in the graph of FIG. 1 A which shows that $V_{DS}$ increases with current as well as temperature. The maximum temperature of operation for the device shown is 160° C. Above 160° C., the graph is shown cross-hatched because this is an area of operation in which the device may be damaged. Accordingly, it is desired to maintain the operation of device 10 at a temperature below 160° C.

Figure 1B:
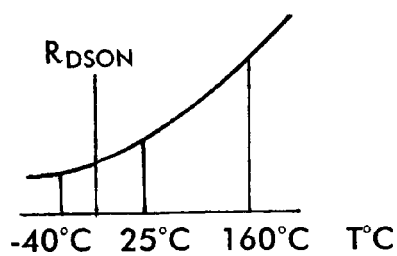
FIG. 1B shows a graph of $R_{DSON}$ versus temperature.

With reference to FIG. 1B which shows in exemplary fashion how $R_{DSON}$ increases with temperature, if the load current is assumed to be constant, then $V_{DS}$ of cell 10A equals $R_{DSON}$ (T°)×IDS, with reference to FIG. 1, where IDS is the drain-source current of cell 10A.

Looking to FIG. 1B, it is apparent that $R_{DSON}$ increases with temperature. $I_R$ equals the current mirror (30,40) ratio multiplied by $I_S$ (which equals the current mirror ratio multiplied by the MOSFET (15,17) ratio multiplied by ILOAD) and is equal to a constant because both the mirror ratio of the current mirror 30,40 and the MOSFET ratio between transistors 15 and 17 as well as ILOAD are constants. Therefore, $V_R$, the voltage across resistor R, is substantially constant. There will thus be a temperature above which $V_{DS}$ is greater than $V_R$. When $V_{DS}$ exceeds $V_R$, the voltage at the inverting input of comparator 50 will drop below the voltage at the non-inverting input, and the operational amplifier 50 will be triggered to output the OTP signal, thus indicating that an overtemperature condition exists.

At a different current level, the trigger temperature is substantially identical since $V_{DS}$ and VR are both proportional to the load current.

In FIG. 1, amplifier 19 sinks the current IS from the current sense cell 10B so that the potential at the source of cell 10B equals the potential at the source of cell 10A. This is because this is a closed loop system and the voltage between the inputs of amplifier 19 are driven to be equal. In this case, IS equals ILOAD times the ratio of (MOSFET sense/main MOSFET area). A current proportional to IS, in the illustrated example, IS/20 due to the action of transistors 15 and 17, is provided to the current mirror comprising transistors 30 and 40 and thus as current IR through resistor R. A voltage proportional to the current in the current mirror transistor 40 is generated across resistor R and compared via amplifier 50 to VDS. If VDS is greater than VR, the OTP signal is generated.

The circuit of FIG. 1 requires a current mirror and is more complex than the circuit now to be described with reference to FIG. 2. The circuit of FIG. 2 also uses less circuit area when made into an integrated circuit.

Additionally, the circuit of FIG. 1 requires a negative supply to sink current IS. This is difficult to implement in a low side configuration. Further, power dissipation is lower in the circuit of FIG. 2 because the circuit of FIG. 1 requires IS to be sinked ($P=IS \times (V_{DD}-V_{RDG})$).

Figure 2:
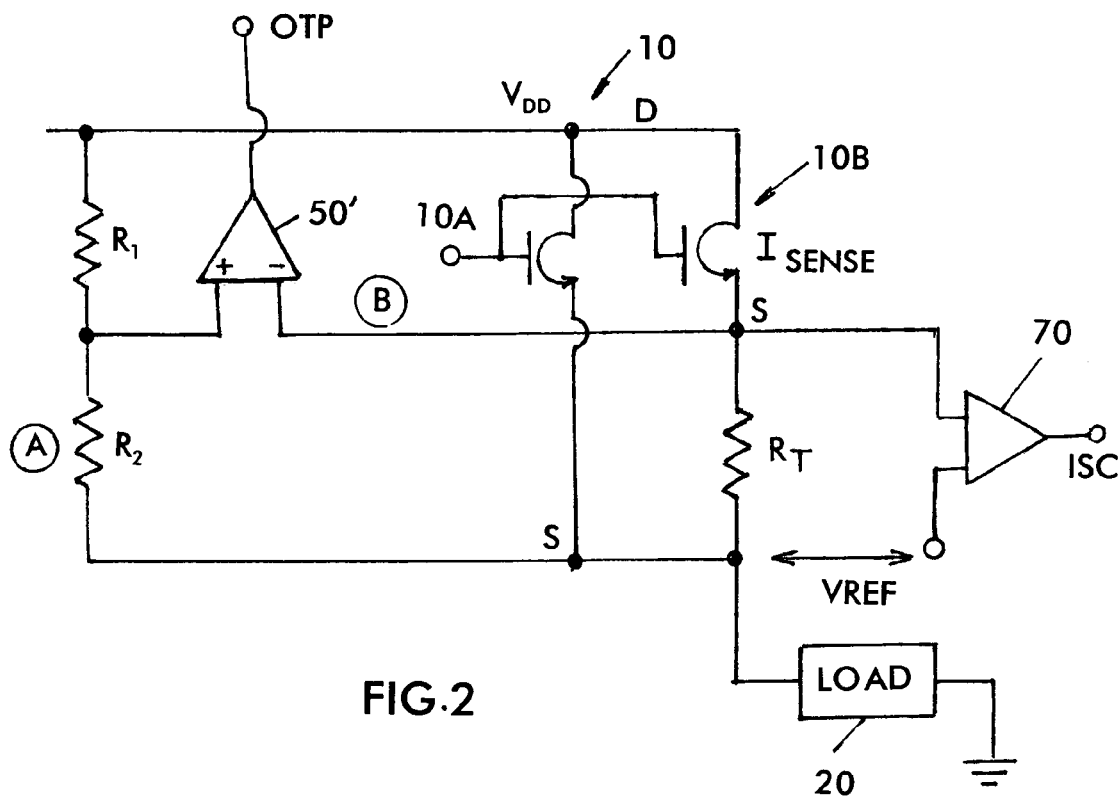
FIG. 2 is a second embodiment of the circuit for remotely determining the temperature of a power MOS device.

FIG. 2 shows a second embodiment which uses a simpler circuit. The power device 10 includes main cell 10A and sense cell 10B. Sense cell 10B is coupled to a resistor $R_T$ to a common point with the source of cell 10A. This source connection is coupled to a load 20 in the manner shown. A comparator 50' has one input coupled to the source terminal of the sense cell 10B and the other input coupled to the output of a resistor voltage divider. In particular, the inverting terminal is coupled to the source terminal of the sense cell 10B. The non-inverting terminal of comparator 50' is coupled across the resistor voltage divider coupled between drain and source comprising resistors R1 and R2. In addition, a short circuit current comparator 70 may be provided coupled across, resistor $R_T$.

Figure 2A:
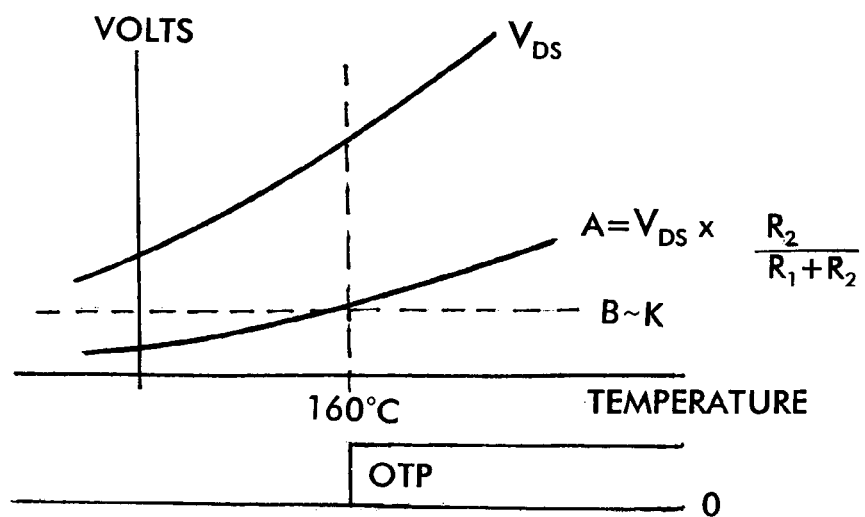
FIG. 2A is a graph explaining the operation of the circuit of FIG. 2.

The circuit operates as follows. If the load current is assumed to be constant, and RT to be a low value resistor so that the voltage across it is small, $I_{RT} \approx $ ILOAD/ratio (area of power MOSFET/area of sense cell). This is approximately constant because of the small resistance value. It is acutally not a constant, but compared to voltage $V_{DS}$, it is substantially constant. R1 and R2 operate as a voltage divider to provide a voltage at node A proportional to $V_{DS}$. This is shown in FIG. 2A. The voltage at node A is equal to $V_{DS}$ times R2(R1+R2). The voltage at node B is equal to the voltage across the resistor RT which will be small and approximately constant. As the voltage $V_{DS}$ increases with temperature in proportion to $R_{DSON}$ as shown in FIG. 1B, the voltage at node A will become larger than the voltage at node B and the OTP signal will be generated by comparator 50' when the temperature exceeds a present level, here shown as 160° C.

In addition, comparator 70 provides a short circuit current detection signal in the event the current through resistor RT and accordingly the voltage across it exceeds a preset level determined by $V_{REF}$.

FIG. 2A shows the operation of the circuit of FIG. 2. As shown, line A represents the voltage at the output of the voltage divider R1 and R2. Voltage B represents the voltage across resistor RT which is approximately a constant. As the temperature increases, the voltage A increases above voltage B and the comparator generates the signal OTP.

Although the circuits according to the invention are shown as discrete devices and/or components, the various component are preferably packaged in an integrated circuit, and the components may be made in a way well known to those of skill in the art. For example, the various comparators shown may be developed in known ways from conventional electronic building blocks used in the IC art for making comparator circuits.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. Apparatus for indirectly sensing the temperature of a power MOS device comprising:
   a power MOS device having a current sense circuit for sensing a current in the power MOS device;
   a circuit for producing a voltage related to a drain-source voltage of the power MOS device;
   a comparator coupled to receive at a first input the voltage related to the drain-source voltage of the power MOS device and at a second input a voltage related to the current in the power MOS device;

the comparator generating an overtemperature protection signal when a predetermined inequality between the voltages at the first and second inputs to the comparator occurs, wherein the circuit for producing a voltage related to the drain-source voltage comprises a voltage divider coupled between the drain and source of the power MOS device.

2. The apparatus of claim 1, wherein the power MOS device has a main current cell and a current sense cell, the current sense cell comprising the current sense circuit, and the voltage divider is coupled between the drain and source of the main current cell.

3. The apparatus of claim 2, wherein the comparator has the first input connected to an output of the voltage divider and the second input coupled to the source of the current sense cell.

4. The apparatus of claim 1, wherein the voltage divider comprises first and second resistors with an output coupled to the first input of the comparator.

5. The apparatus of claim 4, wherein the current sense cell is coupled in series with a resistor, the current sense cell and resistor being coupled across the main current cell, a common connection of the current sense cell and the resistor being coupled to the second input of the comparator.

6. The apparatus of claim 3, wherein the first input to the comparator comprises a non-inverting input and the second input comprises an inverting input.

7. The apparatus of claim 5, wherein the resistor comprises a precision resistor.

8. The apparatus of claim 5, further comprising a second comparator coupled across said, resistor for providing a signal indicative of a short circuit condition.

9. Apparatus for indirectly sensing the temperature of a power MOS device comprising:

a power MOS device having a current sense circuit for sensing the current in the power MOS device;

a voltage divider coupled between the drain and source of the power MOS device;

a comparator coupled to receive at a first input an output of the voltage divider and at a second input a voltage related to the current in the power MOS device;

the comparator generating an overtemperature protection signal when a predetermined inequality between the voltages at the first and second inputs to the comparator occurs.

10. The apparatus of claim 9, wherein the predetermined inequality is that the voltage at the first input of the comparator exceeds the voltage at the second input.

11. The apparatus of claim 9, wherein the power MOS device has a main current cell and a current sense cell, the current sense cell comprising the current sense circuit, and the voltage divider is coupled between the drain and source of the main current cell.

12. The apparatus of claim 11, wherein the comparator has the first input connected to an output of the voltage divider and the second input coupled to the source of the current sense cell.

13. The apparatus of claim 11, wherein the voltage divider comprises first and second resistors with an output coupled to the first input of the comparator.

14. The apparatus of claim 13, wherein the current sense cell is coupled in series with a resistor, the current sense cell and resistor being coupled across the main current cell, a common connection of the current sense cell and the resistor being coupled to the second input of the comparator.

15. The apparatus of claim 14, wherein the resistor comprises a precision resistor.

16. The apparatus of claim 14, further comprising a second comparator coupled across said resistor for providing a signal indicative of a short circuit condition.

17. A method for indirectly sensing the temperature of a power MOS device comprising:

sensing a first voltage related to the drain-source voltage of the power MOS device;

sensing a second voltage related to the current in the power MOS device;

comparing the first and second voltages; and generating an overtemperature protection signal when a predetermined inequality between the first and second voltages occurs, wherein the step of sensing the first voltage comprises sensing a first voltage from a resistor voltage divider coupled across the drain-source path of the power MOS device.

18. The method of claim 17, further comprising sensing the second voltage by sensing a voltage across a resistor coupled in series with the current sense cell, the current sense cell and resistor being coupled across a main current cell of the power MOS device.

19. The method of claim 18, wherein the step of sensing the second voltage comprises sensing the second voltage across a resistor comprising a precision resistor.

20. The method of claim 18, further comprising comparing the voltage across said resistor for providing a signal indicative of a short circuit condition.

* * * * *